United States Patent [19]

Suzuki et al.

[11] Patent Number: 5,395,474
[45] Date of Patent: Mar. 7, 1995

[54] APPARATUS AND METHOD FOR ETCHING SEMICONDUCTOR WAFER

[75] Inventors: Hidenao Suzuki; Tatsuya Nishimura, both of Kanagawa; Yoshio Hatada, Tokyo, all of Japan

[73] Assignee: Ebara Corporation, Tokyo, Japan

[21] Appl. No.: 268,547

[22] Filed: Jul. 6, 1994

Related U.S. Application Data

[63] Continuation of Ser. No. 26,802, Mar. 5, 1993, abandoned.

[30] Foreign Application Priority Data

Mar. 6, 1992 [JP] Japan ................................. 4-084554

[51] Int. Cl.⁶ .............................................. C23F 1/02
[52] U.S. Cl. .................................................. 156/345
[58] Field of Search ................ 156/345, 643; 250/251

[56] References Cited

U.S. PATENT DOCUMENTS

| | | | |
|---|---|---|---|
| 4,049,533 | 9/1977 | Golyanov | 204/298 |
| 4,713,542 | 12/1987 | Campana | 250/251 |
| 4,733,073 | 3/1988 | Becker | 250/288 |
| 4,740,298 | 4/1988 | Andresen | 210/198.3 |
| 4,920,264 | 4/1990 | Becker | 250/282 |
| 5,055,672 | 10/1991 | Nagai | 250/251 |
| 5,111,042 | 5/1992 | Sullivan | 250/251 |
| 5,216,241 | 6/1993 | Hatakeyama | 250/251 |
| 5,221,841 | 6/1993 | Nagai | 250/251 |
| 5,238,499 | 8/1993 | van de Ven | 118/724 |
| 5,243,189 | 9/1993 | Nagai | 250/251 |
| 5,266,154 | 11/1993 | Tatsumi | 156/643 |
| 5,284,544 | 2/1994 | Mizutani | 156/345 |

FOREIGN PATENT DOCUMENTS

| | | |
|---|---|---|
| 0219826 | 4/1987 | European Pat. Off. . |
| 0502429 | 9/1992 | European Pat. Off. . |

OTHER PUBLICATIONS

Wolf, Silicon Processing for the VLSI ERA, vol. 1, 1986, pp. 392–393.

Tatsumi Mizutani & Takashi Yunogami, "Neutral-Beam-Assisted Etching of $SiO_2$—A Charge-Free Etching Process", vol. 29, No. 10, Oct. 1970, p. 2220–2222.

Sakaue, Iseda, Asami, Yamamoto, "Atomic Layer Controlled Digital Etching of Silicon", Japanese Journal of Applied Physics, vol. 29, No. 11, Nov. 1990, pp. 2648–2652.

Meguro, Ishii, Kodama, Hamagaki, Hara, Yamamoto, Aoyagi, "Layer-By-Layer Controlled Digital Etching by Means of an Electron-Beam-Excited Plasma System", Jap. J. of Applied Physics, vol. 29, No. 10, Oct. 1990, pp. 2216–2219.

Horiike, Tanaka, Nakano, Iseda, Sakaue, Shido, Miyazaki, Hirose, "Digital chemical vapor deposition and etching technologies for semiconductor processing".

Mizutani, Yunogami, Tsujimoto, "Lower plasma-induced damage in $SiO_2$/Si at lower temperatures", Appl. Phys. Lett. 57(16), 15 Oct. 1990, pp. 1654–1656.

Barker, Mayer, Pearson, "Surface studies of and a mass balance model for $Ar^+$ ion-assisted $Cl_2$ etching of Si".

Mele, Nulman, Krusius, "Selective and anisotropic reactive ion etch of LPCVD silicon nitride with $CHF_3$ based gases".

Harold F. Winters, "The role of chemisorption in plasma etching", J. Appl. Phys. 49(10), Oct. 1978, pp. 5165–5170.

Mizutani et al., "Neutral-Beam-Assisted Etching of $SiO_2$—A Charge-Free Etching Process", *Japanese Journal of Applied Physics*, 1990, pp. 166–168.

Patent Abstracts of Japan, vol. 15, No. 383 (E-1116) Sep. 27, 1991.

Kuwano et al., "Silicon dioxide fine patterning by reactive fast atom beam etching", *Journal of Vacuum Science and Technology: Part B*, vol. 6, Sep. 1988, 1565–1569.

*Primary Examiner*—R. Bruce Breneman
*Assistant Examiner*—Joni Y. Chang
*Attorney, Agent, or Firm*—Wenderoth, Lind & Ponack

[57] ABSTRACT

A semiconductor wafer etching apparatus is capable of anisotropically etching a large-diameter semiconductor wafer with high accuracy without causing the semiconductor wafer to be charged. First, the apparatus cools the wafer in an atmosphere of a nitrogen or a halogen gas so that the wafer adsorbs and is covered by atoms of the gas. Then, a fast atom beam source of the apparatus generates an electrically neutral fast atom beam of gas atoms or molecules to etch the semiconductor wafer. The etching speed is promoted by an interaction of the adsorbed atoms and the fast atom beam.

7 Claims, 3 Drawing Sheets

APPARATUS AND METHOD FOR ETCHING SEMICONDUCTOR WAFER

This application is a continuation of now abandoned application, Ser. No. 08/026,802, filed Mar. 5, 1993, abandoned.

BACKGROUND OF THE INVENTION

1. Field of the Invention

The present invention relates to a semiconductor wafer etching apparatus and, more particularly, to an apparatus for etching a semiconductor wafer with a fast atom beam.

2. Prior Art

Semiconductor devices are decreasing in size year by year. Nowadays, highly integrated LSIs, e.g., 16 Mega (M) to 64 M bit memories, are being produced. In the process of producing these semiconductor devices, etching apparatuses are used to etch thin films formed by sputtering, CVD, etc. into desired circuit patterns, Such etching apparatuses are must to be capable of effecting finer etching at a higher reaction rate and with improved selectivity and also must be compatible with wafers having large diameters.

Conventional etching apparatuses of the type described above have heretofore been arranged to etch specimens, e.g., semiconductor wafers, chemically and physically by using charged particles such as those in a plasma or ions. Therefore, the conventional etching apparatuses have disadvantages as stated below.

I. With the etching process that employs a plasma, anisotropic etching cannot be effected because it is impossible to control the direction of incidence of charged particles or active species impinging the substrate surface.

II. When an insulating film such as $SiO_2$ is etched by using ions, for example, the semiconductor substrate itself may be charged with electricity. There is, therefore, a likelihood that the etching will not proceed, or dielectric breakdown of the insulating film will occur due to the charged substrate.

III. When etching is carried out by using an ion beam, the beam is likely to diverge due to the repulsion between ions, so that it is difficult to maintain the required etching accuracy.

IV. Charged particles are readily affected by a magnetic field or the condition of the atmosphere because of their electrical properties. Therefore, it is difficult to etch semiconductor wafers having large diameters by using charged particles.

In addition, the conventional etching apparatuses of the type described above suffer from the disadvantage that the semiconductor wafer surface may be contaminated by impurities generated from the apparatus or impurities in the atmosphere before, after or during the etching operation.

SUMMARY OF THE INVENTION

In view of the above-described problems of the prior art, it is an object of the present invention to provide a semiconductor wafer etching apparatus capable of anisotropic etching and also capable of etching a large-diameter semiconductor wafer with high accuracy without causing the semiconductor wafer to be charged.

To achieve this object, the present invention provides a semiconductor wafer etching apparatus which uses an electrically neutral fast atom or molecule beam to etch the wafer and means by which a gas e.g., fluorine, chlorine, bromine, etc., is supplied so as to be adsorbed by a semiconductor wafer at a low temperature, thereby keeping the semiconductor wafer clean, and moreover enhancing the reaction rate and the selectivity due to the interaction between the adsorbed atoms and the fast atom beam.

More specifically, according to the present invention, a semiconductor wafer etching apparatus comprises a cooling means for cooling a semiconductor wafer in an atmosphere of nitrogen gas or a halogen gas so that said semiconductor wafer adsorbs said gas and is covered with atoms of said gas, a fast atom beam source for generating an electrically neutral fast atom beam of gas atoms or molecules, and reaction means for causing said semiconductor wafer covered with atoms of said gas to be etched by said fast atom beam. The apparatus also comprises process gas supply means for supplying process gas to said fast atom beam source and a beam shutter means for cutting off said atom beam when said atom beam is unstable.

The cooling means comprises a preliminary chamber, first gate means for carrying said semiconductor wafer to or from said preliminary chamber, cooling system, vacuum means for evacuating said preliminary chamber and gas supply means for supplying said preliminary chamber with nitrogen gas or a halogen gas.

The reaction means comprises a main reaction chamber, second gate means for carrying said semiconductor wafer to or from said main reaction chamber, vacuum means for evacuating said main reaction chamber, stage means for lifting and rotating said semiconductor wafer while said fast atom beam impinges it, and heating means for heating said semiconductor wafer while said fast atom beam impinges it.

The main feature of the present invention resides in that a gas, e.g., fluorine, chlorine, bromine, etc., is introduced in a preliminary chamber so as to be adsorbed by a semiconductor wafer at a low temperature, and this semiconductor wafer is etched by being irradiated with a fast atom beam of an element, e.g., fluorine, chlorine, oxygen, bromine, hydrogen, etc., and a compound of these elements in a main reaction chamber, and that after the completion of the etching process, a gas, e.g., fluorine, is again adsorbed by the semiconductor wafer to keep it clean. The present invention differs from the prior art in that in the preliminary chamber, which has been employed merely for isolating the main reaction chamber from the atmosphere in the prior art, the semiconductor wafer adsorbs a gas, e.g., fluorine, chlorine, bromine, etc., at a low temperature in addition to being isolated from the atmosphere. Further, an electrically neutral fast atom beam is employed for the etching process instead of ions or a plasma, whereby the interaction between the fast atom beam and the adsorbed atoms promotes the etching process. Still further, after the completion of the etching process, a gas, e.g., fluorine, is again adsorbed by the semiconductor wafer to keep it clean.

DETAILED DESCRIPTION OF THE PREFERRED EMBODIMENTS

Figure 1:
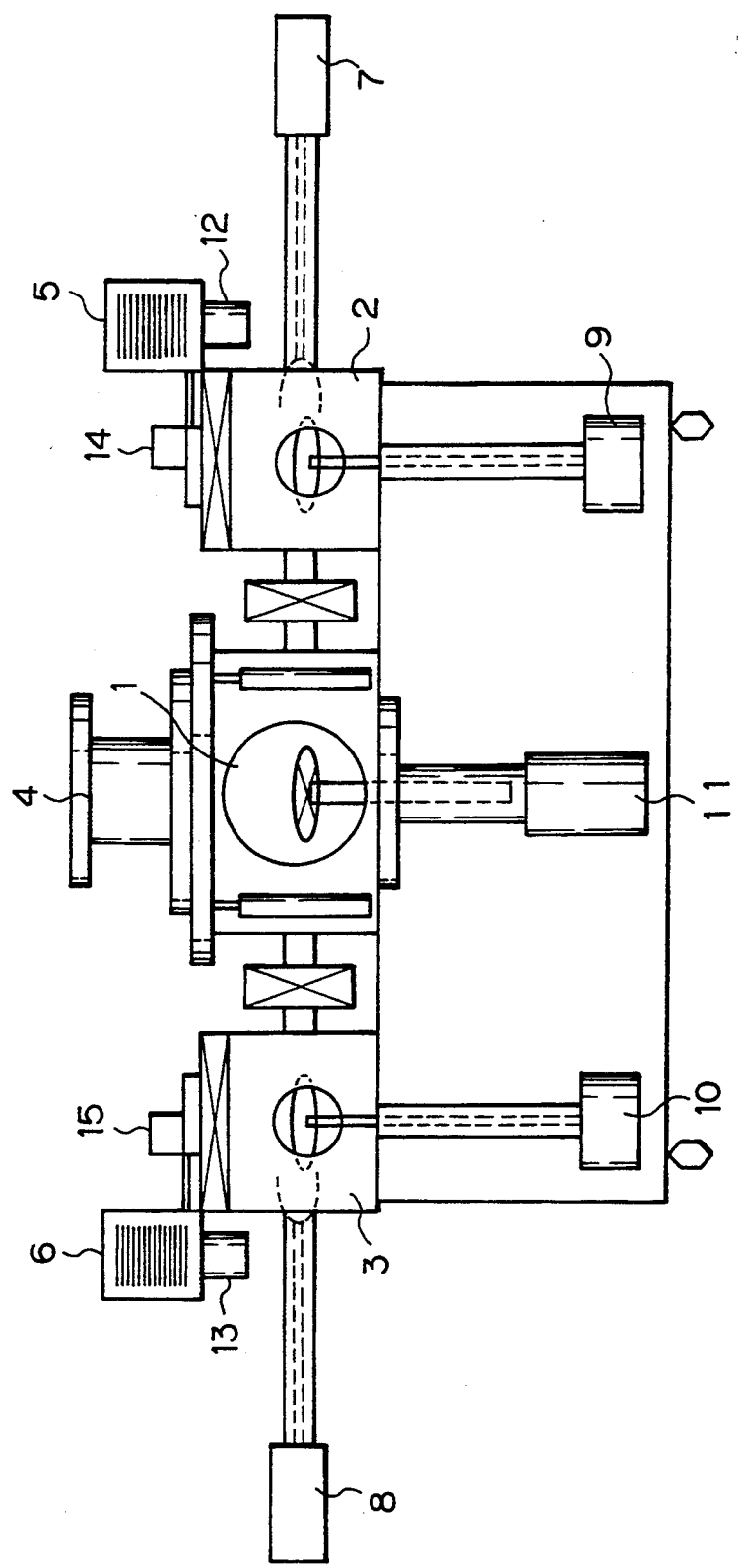
FIG. 1 shows one embodiment of a semiconductor wafer etching apparatus according to the present invention.

FIG. 1 shows a semiconductor wafer etching apparatus according to the present invention. A chamber system includes a main reaction chamber 1, and preliminary chambers 2 and 3. Reference numeral 4 denotes a fast atom beam source. Reference numeral 5 denotes a cassette loader, 6 a cassette unloader, 7 and 8 transfer arms, 9 a loader arm, 10 an unloader arm, and 11 a wafer rotating and lifting stage. These elements constitute a transfer system for transferring a semiconductor wafer. Reference numerals 12, 13, 14 and 15 denote rectilinear mechanisms. These mechanisms drive the cassette loader 5 and the cassette unloader 6 to transfer a semiconductor wafer.

Figure 2A:
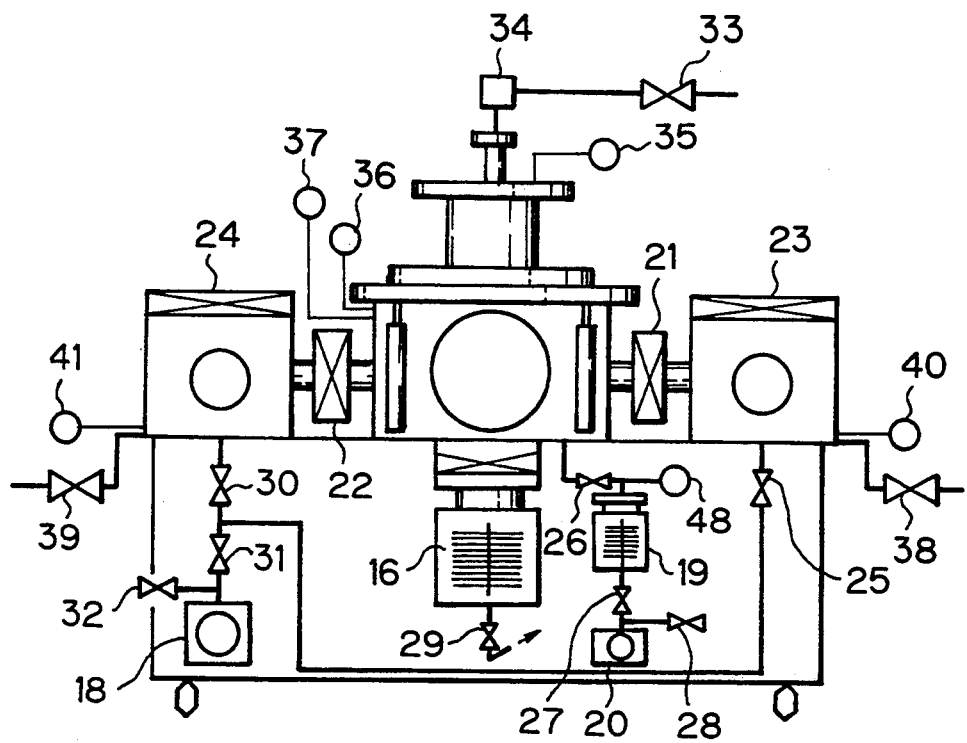
FIG. 2(A) is a front view of a gas supply/evacuation system of the etching apparatus.
Figure 2B:
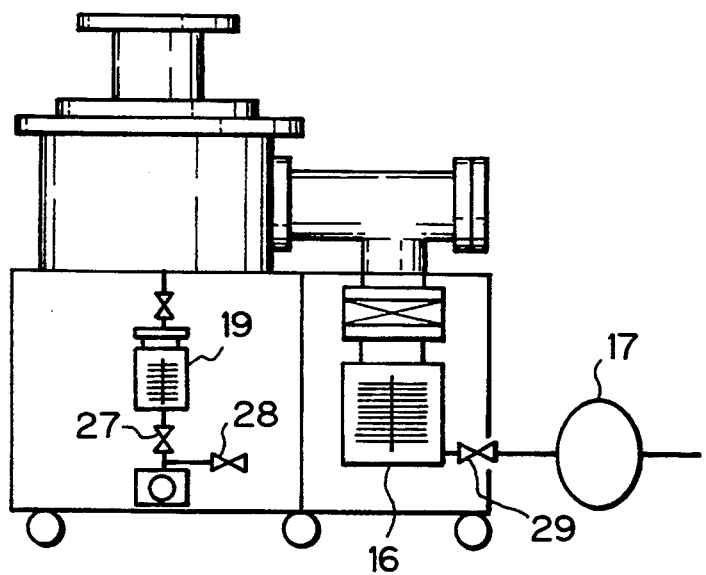
FIG. 2(B) is a side view of the same.

FIG. 2(A) is a front view of a gas supply/evacuation system of the etching apparatus, and FIG. 2(B) is a side view thereof. The evacuation system will first be explained. A main process pump 16 and a roughing vacuum pump 17 are used to evacuate the main reaction chamber 1 and the fast atom beam source 4. A roughing vacuum pump 18 is used to evacuate the preliminary chambers 2 and 3. A main process pump 19 and a roughing vacuum pump 20 are provided for the purpose of mass spectrometric analysis. Gate valves 21, 22, 23 and 24 are used to separate the vacuum chambers from each other. Valves 25, 26, 27, 28, 29, 30, 31 and 32 are used to isolate the pump evacuation systems from each other.

A valve 33, a mass flow controller 34 and vacuum gauges 35, 36 and 37 are used to introduce a process gas comprising an element, e.g., fluorine, chlorine, oxygen, bromine, hydrogen, etc. and a compound of these elements, into the vaccum chamber and to control the pressure within the chamber. Valves 38 and 39 and vacuum gauges 40 and 41 are used to introduce nitrogen gas or a gas, e.g., fluorine, chlorine, bromine, etc., into the preliminary chambers 2 and 3 and to measure the pressure.

Figure 3B:
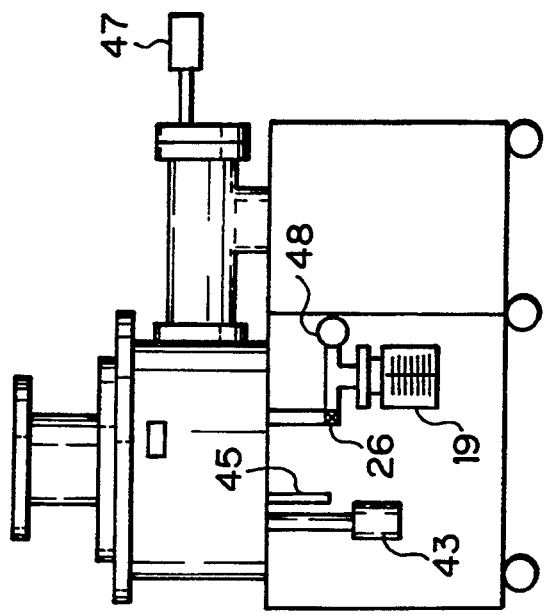
FIG. 3(B) is a side view of the same.
Figure 3A:
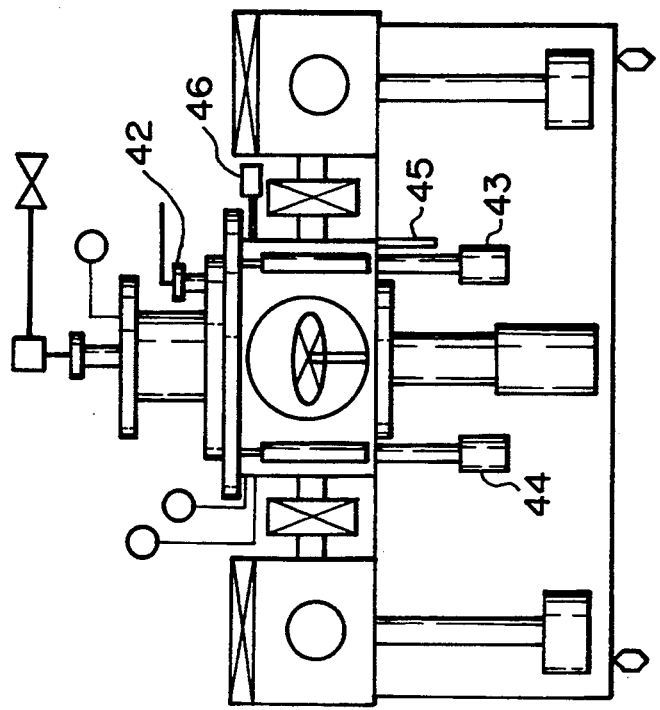
FIG. 3(A) is a front view of an analyzing system of the etching apparatus.

FIG. 3(A) is a front view of an analyzing system of the main reaction chamber of the etching apparatus, and FIG. 3(B) is a side view thereof. A high-voltage supply current lead-in terminal 42 is used to produce an electric discharge in a discharge space provided in the fast atom beam source 4. Infrared lamps 43 and 44 are used to heat a semiconductor wafer as a specimen. A photoelectric sensor 45 and a reflector 46 are provided to stop the rotation of the stage at a predetermined position. A beam shutter 47 is used to cut off the fast atom beam from the fast atom beam source 4. A mass spectrometer 48 is used to make an analysis in the main reaction chamber 1.

The operation of the semiconductor wafer etching apparatus according to the present invention will be explained below with reference to FIGS. 1, 3(B). With the gate valves 21, 22, 23 and 24 closed, the main reaction chamber 1 is first roughly evacuated by using the roughing vacuum pump 17 and then evacuated to a high-vacuum region by using the main process pump 16. At the same time, the preliminary chambers 2 and 3 are also evacuated to a pressure in the region of $10^{-3}$ Torr by using the roughing vacuum pump 18. After the completion of the evacuation, nitrogen gas is introduced into the preliminary chamber 2 by opening the valve 38 with the valve 25 remaining closed. When the pressure becomes near the atmospheric pressure, the gate valve 23 is opened.

Next, means for subjecting the semiconductor wafer to a specified gas and for cooling the wafer such that the wafer adsorbs and is covered by atoms of the gas will be described.

An arm 9 (transfer means) is associated with the rectilinear mechanism 14 and takes out a semiconductor wafer from the cassette loader 5 which moves vertically on the rectilinear mechanism 12. The loader arm 9 moves up to receive the semiconductor wafer and then moves down to carry it into the preliminary chamber 2. Then, the valve 23 and the valve 38 are closed and the valve 25 is opened, and the preliminary chamber 2 is evacuated to a pressure in the region of $10^{-3}$ Torr. After that, the valve 25 is closed and the valve 38 is opened, thus fluorine, chlorine bromine etc., is introduced into the preliminary chamber. The preliminary chamber 2 is provided with a semiconductor wafer cooling system, for example, a liquid nitrogen cooling system provided in a stage on which the semiconductor wafer is placed, thereby cooling the semiconductor wafer to a low temperature. By using this cooling system, atoms of the introduced gas, e.g., fluorine, chlorine, bromine, etc., are adsorbed on the semiconductor wafer at a low temperature. Next, a reaction means for causing the semiconductor wafer to be etched with a fast atom beam, generated by the fast atom beam source 4, will be described.

The transfer arm 7 (transfer means) receives the semiconductor wafer, and the valve 25 is opened to a pressure in evacuate the preliminary chamber 2 to the region of $10^{-3}$ Torr. After the completion of the evacuation, the gate valve 21 opens, and the transfer arm 7 carries the semiconductor wafer into the main reaction chamber 1 and transfers it to the wafer rotating and lifting stage 11. After the transfer arm 7 has returned to the preliminary chamber 2, the gate valve 21 is closed to initiate the etching of the wafer with a fast atom beam.

First, the valve 33 is opened to introduce a process gas comprising an element, e.g., fluorine, chlorine, oxygen, bromine, hydrogen, etc., and a compound of these elements into the fast atom beam source 4 with the flow rate being controlled by the mass flow controller 34. It should be noted that the vacuum gauge 35 is used to measure the pressure in the fast atom beam source 4, while the vacuum gauges 36 and 37 are used to measure the pressure in the main reaction chamber 1. Next, a high voltage is applied to electrodes placed in the discharge space of the fast atom beam source 4 through the high-voltage supply current lead-in terminal 42 to generate an electrically neutral fast atom beam of gas atoms or molecules. At this time, the beam shutter 47 is disposed in front of the fast atom beam source 4 to cut off the beam. When the fast atom beam has become stable, the wafer rotating and lifting stage 11 raises the semiconductor wafer as a specimen to a predetermined position. Then, the beam shutter 47 is withdrawn to allow the fast atom beam to impinge the semiconductor wafer. At the same time, the semiconductor wafer is heated by the infrared lamps 43 and 44, and the stage 11 is continuously rotated. In this way, etching is performed. In addition, reaction products formed in the main reaction chamber 1 are measured by using the mass spectrometer 48. It should be noted that the details of the fast atom beam source 4 are disclosed, for example, in Japanese Patent Application No. 3-261231 (1991).

Upon completion of the etching, the beam shutter 47 is advanced to cut off the fast atom beam. The stage 11 is stopped from rotating at a predetermined position by using the photoelectric sensor 45 and the reflector 46. At this time, the gate valve 22 opens, and the transfer arm 8 receives the semiconductor wafer which has undergone the etching process. The transfer arm 8 (transfer means) carries the semiconductor wafer to the center of the preliminary chamber 3 and transfers it to the stage of the unloader arm 10. Then, the gate valve 22 and the valve 30 are closed, while valve 39 is opened to introduce a gas, e.g., fluorine, chlorine, bromine, etc., into the preliminary chamber 3, whereby the semiconductor wafer adsorbs atoms of fluorine, chlorine, bromine, etc. at a low temperature. The stage on which the semiconductor wafer is placed is provided with a cooling system, for example, a liquid nitrogen cooling system, to cool the semiconductor wafer. Then, the valve 39 is closed and the valve 30 is opened, and the preliminary chamber 3 is evacuated to a pressure in the region of $10^{-3}$ Torr. After that, the valve 30 is closed and the valve 39 is opened; thus nitrogen gas is introduced into the preliminary chamber 3. When the pressure becomes near the atmospheric pressure, the gate valve 24 is opened. Then, the unloader arm 10 moves up and transfers the semiconductor wafer to an arm that is associated with the rectilinear mechanism 15. The semiconductor wafer is then loaded into the cassette loader 6, which moves up and down by the operation of the rectilinear mechanism 13. Thus, the whole process of etching is completed. The above-described operations are automatically carried out under control of a computer that is provided on a control panel.

As has been described above, the etching apparatus of the present invention has a fast atom beam source and a semiconductor wafer cooling means. Consequently, there is no contact with the atmosphere during a series of steps in the semiconductor wafer etching process, and there is no possibility of the semiconductor wafer being contaminated by impurities. In addition, since the semiconductor wafer surface is covered with atoms of fluorine, chlorine, bromine, etc., a clean and fine etching process can be realized. Further, the automation allows a rise in the etching rate and an increase in the number of substrates which can be etched. Since the present invention employs an electrically neutral fast atom beam, it is possible to solve serious problems presently existing in the semiconductor manufacturing process, i.e., charge-up, problems of non-vertical etching in the semiconductor wafer in the case of using a beam of charged particles which diverges by the repulsion between ions, and damage to the substrate by ions. Accordingly, it is possible to realize finer etching with high accuracy, which has heretofore been impossible to attain because of the above-described problems. In addition, another problem attendant on the prior art, that is, a relatively low reaction rate and selectivity, can be overcome by selecting an element for the fast atom beam and atoms to be adsorbed in conformity with the substrate and thin film to be etched. With the above-described contrivance, the present invention can also cope with large-diameter wafers appearing with the increase in the integration density, i.e., 16 M to 64 M bit memories.

What is claimed is:

1. A semiconductor wafer etching apparatus comprising: cooling means for subjecting a semiconductor wafer to an atmosphere of a nitrogen or halogen gas and cooling the semiconductor wafer within said atmosphere such that the semiconductor wafer adsorbs the gas and is covered with atoms of the gas; a fast atom beam source which generates an electrically neutral fast beam of gas atoms or molecules; process gas supply means for supplying a process gas to said fast atom beam source; reaction means for causing the semiconductor wafer having adsorbed and been covered with atoms of the nitrogen or halogen gas to be etched with the fast atom beam, whereby the speed at which the semiconductor wafer is etched is promoted by an interaction between the fast atom beam and the atoms adsorbed by the semiconductor wafer; a chamber communicating with said reaction means; a first gate valve located between said cooling means and said reaction means, said first gate valve being movable between open and closed positions, said first gate valve isolating the reaction means from the cooling means when in said closed position thereof, and said first gate valve allowing a semiconductor wafer to be transferred from the cooling means to the reaction means when in said open position thereof; and a second gate valve located between said reaction means and said chamber, said second gate valve being movable between opened and closed positions, said second gate valve isolating the chamber from the reaction means when in said closed position thereof, and said second gate valve allowing a semiconductor wafer to be transferred from the reaction means into said chamber when in the open position thereof.

2. A semiconductor wafer etching apparatus as claimed in claim 1, wherein said reaction means comprises a stage which supports the semiconductor wafer during the etching of the wafer with the fast atom beam, and further comprising a shutter mechanism operatively interposed between said fast atom beam source and the stage of said reaction means, said shutter mechanism being operative to selectively block the fast atom beam to prevent the beam from impinging a semiconductor wafer supported by said stage and to allow the fast atom beam to impinge the semiconductor wafer supported by said stage.

3. A semiconductor wafer etching apparatus as claimed in claim 1, wherein said cooling means comprises a preliminary chamber, a cooling system disposed in said preliminary chamber, vacuum means for evacuating said preliminary chamber, and gas supply means for supplying said preliminary chamber with a nitrogen or halogen gas, and further comprising first transfer means for transferring a semiconductor wafer from said cooling means to said reaction means through said first gate valve while the first gate valve is in the open position thereof.

4. A semiconductor wafer etching apparatus as claimed in claim 1, wherein said reaction means comprises a main reaction chamber, vacuum means for evacuating said reaction chamber, stage means for lifting a semiconductor wafer to an etching position in said reaction chamber and rotating the semiconductor wafer at said etching position, and heating means for heating the semiconductor wafer in the reaction chamber.

5. A semiconductor wafer etching apparatus comprising: a chamber system including first, second and third chambers; a cooling system disposed in said first chamber so as to cool a semiconductor wafer placed in the first chamber; first gas supply means for supplying at least one of a nitrogen gas and a halogen gas into said first chamber such that a semiconductor wafer in the first chamber and cooled by said cooling system will adsorb the gas and be covered by atoms of the gas; a fast atom beam source which generates an electrically neutral fast atom beam of gas atoms or molecules, said fast atom beam source communicating with said second chamber such that the fast atom beam will be introduced into said second chamber to etch a semiconductor wafer having adsorbed and been covered with the gas; process gas supply means for supplying a process gas to said fast atom beam source; a first gate valve located between said first and second chambers, said first gate valve being movable between open and closed positions, said first gate valve isolating the first chamber from the second chamber when in said closed position thereof, and said, first gate valve allowing a semiconductor wafer to be transferred from the first chamber into the second chamber when in said open position thereof; and a second gate valve located between said second and said third chambers, said second gate valve being movable between opened and closed positions, said second gate valve isolating the third chamber from the second chamber when in said closed position thereof, and said second, gate valve allowing a semiconductor wafer to be transferred from the second chamber into said third chamber when in the open position thereof.

6. A semiconductor wafer etching apparatus as claimed in claim 5, and further comprising a stage which supports the semiconductor wafer in said second chamber when the semiconductor wafer is etched using the fast atom beam, and a shutter mechanism operatively interposed between said fast atom beam source and said stage, said shutter mechanism being operative to selectively block the fast atom beam to prevent the beam from impinging a semiconductor wafer on said stage and to allow the fast atom beam to impinge a semiconductor wafer on said stage.

7. A semiconductor wafer etching apparatus as claimed in claim 5, and further comprising a rotary stage disposed in said second chamber, an elevator connected to said rotary stage, and a heater disposed in said second chamber.

* * * * *